US012598697B2

(12) United States Patent
Shimamura et al.

(10) Patent No.: US 12,598,697 B2
(45) Date of Patent: Apr. 7, 2026

(54) CIRCUIT BOARD AND MULTILAYER CIRCUIT BOARD

(71) Applicant: Murata Manufacturing Co., Ltd., Nagaokakyo (JP)

(72) Inventors: Takayuki Shimamura, Nagaokakyo (JP); Tomohiro Furumura, Nagaokakyo (JP); Sunao Fukutake, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 644 days.

(21) Appl. No.: 18/096,613

(22) Filed: Jan. 13, 2023

(65) Prior Publication Data

US 2023/0145378 A1 May 11, 2023

Related U.S. Application Data

(63) Continuation of application No. PCT/JP2021/027659, filed on Jul. 27, 2021.

(30) Foreign Application Priority Data

Aug. 12, 2020 (JP) .................................. 2020-136414
May 13, 2021 (JP) .................................. 2021-081846

(51) Int. Cl.
  *H05K 1/03* (2006.01)
  *B32B 7/02* (2019.01)
  (Continued)

(52) U.S. Cl.
  CPC .............. *H05K 1/036* (2013.01); *B32B 7/02* (2013.01); *B32B 15/085* (2013.01); *B32B 15/20* (2013.01);
  (Continued)

(58) Field of Classification Search
  CPC .... H05K 1/036; H05K 1/0237; H05K 1/0373; H05K 2201/0141; H05K 2201/0154;
  (Continued)

(56) References Cited

U.S. PATENT DOCUMENTS

2006/0035067 A1 2/2006 Watanabe et al.
2008/0107866 A1 5/2008 Iwasa et al.
(Continued)

FOREIGN PATENT DOCUMENTS

JP 2004098570 A 4/2004
JP 2006228871 A 8/2006
(Continued)

OTHER PUBLICATIONS

Ganatra ("Material Properties of LCP Film and Its Board Applications in IT-Related Devices"). (Year: 2002).*
(Continued)

*Primary Examiner* — Alicia J Weydemeyer
*Assistant Examiner* — Laura B Figg
(74) *Attorney, Agent, or Firm* — Keating & Bennett, LLP

(57) ABSTRACT

A circuit board includes, in order in a stacking direction, a first insulating layer, a second insulating layer in contact with the first insulating layer, and a conductor layer, the first insulating layer includes a liquid crystal polymer as a main component, and the second insulating layer includes a fluoropolymer including at least one of polytetrafluoroethylene and a perfluoroalkoxy alkane and includes a polyimide resin with an imidization rate of about 90% or more, the polyimide resin being present in an amount of about 0.5 parts or more by weight and less than about 20 parts by weight per 100 parts by weight of the fluoropolymer.

21 Claims, 4 Drawing Sheets

(51) Int. Cl.

| | |
|---|---|
| *B32B 15/085* | (2006.01) |
| *B32B 15/20* | (2006.01) |
| *B32B 27/08* | (2006.01) |
| *B32B 27/20* | (2006.01) |
| *B32B 27/28* | (2006.01) |
| *B32B 27/32* | (2006.01) |
| *B32B 27/36* | (2006.01) |
| *H05K 1/02* | (2006.01) |

(52) U.S. Cl.
CPC .............. *B32B 27/08* (2013.01); *B32B 27/20* (2013.01); *B32B 27/281* (2013.01); *B32B 27/322* (2013.01); *B32B 27/36* (2013.01); *H05K 1/0237* (2013.01); *H05K 1/0373* (2013.01); *B32B 2270/00* (2013.01); *B32B 2305/30* (2013.01); *B32B 2305/55* (2013.01); *B32B 2307/202* (2013.01); *B32B 2307/206* (2013.01); *B32B 2457/08* (2013.01); *H05K 2201/0141* (2013.01); *H05K 2201/0154* (2013.01); *H05K 2201/0209* (2013.01)

(58) Field of Classification Search
CPC .............. H05K 2201/0209; B32B 7/02; B32B 15/085; B32B 15/20; B32B 27/08; B32B 27/20; B32B 27/281; B32B 27/322; B32B 27/36; B32B 2270/00; B32B 2305/30; B32B 2305/55; B32B 2307/202; B32B 2307/206; B32B 2457/08
See application file for complete search history.

(56) References Cited

U.S. PATENT DOCUMENTS

| | | | |
|---|---|---|---|
| 2011/0014476 A1* | 1/2011 | Guy ........................ | B32B 27/08 427/388.1 |
| 2016/0136933 A1* | 5/2016 | Park ........................ | B32B 27/08 428/327 |
| 2017/0145242 A1* | 5/2017 | Polastri ................ | C09D 127/18 |
| 2019/0030870 A1* | 1/2019 | Terada .................... | H05K 1/03 |
| 2021/0029823 A1 | 1/2021 | Hosoi et al. | |
| 2021/0212203 A1* | 7/2021 | Kamitsubo ............. | B32B 7/022 |

FOREIGN PATENT DOCUMENTS

| | | | |
|---|---|---|---|
| JP | 2008235833 | A | 10/2008 |
| JP | 2014237769 | A | 12/2014 |
| JP | 2016097677 | A | 5/2016 |
| JP | 2017526757 | A | 9/2017 |
| WO | 2006067970 | A1 | 6/2006 |
| WO | 2016159102 | A1 | 10/2016 |
| WO | 2019188087 | A1 | 10/2019 |
| WO | 2020071473 | A1 | 4/2020 |

OTHER PUBLICATIONS

Official Communication issued in corresponding Chinese Patent Application No. 202180058381.7, mailed on Feb. 14, 2025, 7 pages.
International Search Report in PCT/JP2021/027659, mailed Oct. 26, 2021, 4 pages.
Written Opinion in PCT/JP2021/027659, mailed Oct. 26, 2021, 4 pages.

\* cited by examiner

280B

250

240

270

201

10

X ←⊗Z

Y

CIRCUIT BOARD AND MULTILAYER CIRCUIT BOARD

CROSS REFERENCE TO RELATED APPLICATIONS

This application claims the benefit of priority to Japanese Patent Application No. 2020-136414 filed on Aug. 12, 2020 and Japanese Patent Application No. 2021-081846 filed on May 13, 2021, and is a Continuation Application of PCT Application No. PCT/JP2021/027659 filed on Jul. 27, 2021. The entire contents of each application are hereby incorporated herein by reference.

BACKGROUND OF THE INVENTION

1. Field of the Invention

The present invention relates to a circuit board and a multilayer circuit board.

2. Description of the Related Art

Liquid crystal polymers and fluoropolymers (also referred to as fluorine-based resins) with a low relative permittivity and a low dielectric loss tangent in a radio-frequency region have been known as materials for improving dielectric properties in a radio-frequency region of circuit boards (also referred to as circuit substrates) used in various electronic devices.

For example, International Publication No. WO 2006/067970 discloses a multilayer body for a flexible printed wiring board including a combination of a reinforcing body layer (A) composed of a liquid crystal polymer and an electrical insulator layer (B) composed of a fluorine-containing copolymer.

International Publication No. WO 2016/159102 discloses a laminated sheet for a circuit substrate including a combination of an insulating film of a liquid crystal polymer and an adhesive layer containing a fluorine-based resin.

SUMMARY OF THE INVENTION

In general, a circuit board for use in a radio-frequency region is required to reduce a change in dielectric properties caused by moisture absorption. Although liquid crystal polymers and fluoropolymers are low hygroscopic materials (absorb less moisture), the laminated sheet for a circuit substrate described in International Publication No. WO 2016/159102 contains the fluorine-based resin as a dispersion in the adhesive layer, and the fluorine-based resin cannot exhibit its low hygroscopicity. Thus, the adhesive layer in the laminated sheet for a circuit substrate described in International Publication No. WO 2016/159102 may absorb moisture and impair dielectric properties.

In contrast, in the multilayer body for a flexible printed wiring board described in International Publication No. WO 2006/067970, it is thought that moisture absorption causes less deterioration of dielectric properties. However, the present inventors have discovered that a moisture absorption test, such as a pressure cooker test, of a circuit board, such as the multilayer body for a flexible printed wiring board described in International Publication No. WO 2006/067970, reduces the adhesion between an insulating layer containing a liquid crystal polymer and an insulating layer containing a fluoropolymer.

Preferred embodiments of the present invention provide circuit boards and multilayer circuit boards each having high adhesion between an insulating layer including a liquid crystal polymer and an insulating layer including a fluoropolymer while maintaining dielectric properties before and after moisture absorption.

A circuit board according to a preferred embodiment of the present invention includes, in order in a stacking direction, a first insulating layer, a second insulating layer in contact with the first insulating layer, and a conductor layer, wherein the first insulating layer includes a liquid crystal polymer as a main component, the second insulating layer includes a fluoropolymer including at least one of polytetrafluoroethylene and a perfluoroalkoxy alkane and includes a polyimide resin with an imidization rate of about 90% or more, the polyimide resin being present in an amount of about 0.5 parts or more by weight and less than about 20 parts by weight per 100 parts by weight of the fluoropolymer, and the polyimide resin is a solvent-soluble polyimide resin.

A multilayer circuit board according to another preferred embodiment of the present invention includes at least one circuit board according to the preferred embodiment of the present invention described above.

Preferred embodiments of the present invention provide circuit boards and multilayer circuit boards each having high adhesion between an insulating layer including a liquid crystal polymer and an insulating layer including a fluoropolymer while maintaining dielectric properties before and after moisture absorption.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Circuit boards and multilayer circuit boards according to preferred embodiments of the present invention are described below. The present invention is not limited to the following preferred embodiments, and various modifications may be made in them without departing from the gist of the present invention. The present invention also includes a combination of preferred embodiments described below.

Figure 1:
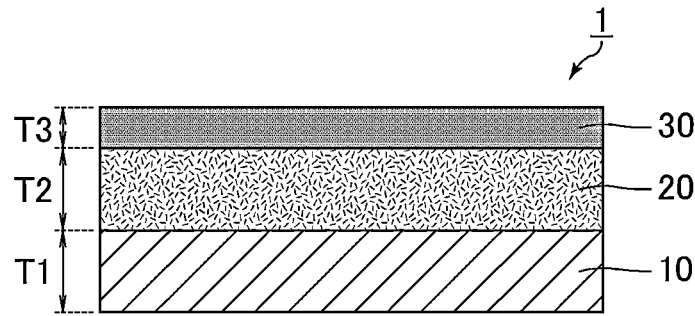
FIG. 1 is a schematic cross-sectional view of an example of a circuit board according to a preferred embodiment of the present invention.

FIG. 1 is a schematic cross-sectional view of an example of a circuit board according to a preferred embodiment of the present invention.

As illustrated in FIG. 1, a circuit board 1 includes, in order in a stacking direction (in the vertical direction in FIG. 1), a first insulating layer 10, a second insulating layer 20, and a conductor layer 30. More specifically, in the circuit board 1, the first insulating layer 10, the second insulating layer 20, and the conductor layer 30 are stacked in order in the stacking direction.

The first insulating layer 10 includes a liquid crystal polymer (LCP) as a main component. Among thermoplastic resins, liquid crystal polymers have low hygroscopicity. Thus, the dielectric properties of the circuit board 1 change little.

In the present description, a main component of each layer or each member refers to a component with the highest content (weight percentage) in the layer or member.

Liquid crystal polymers are generally classified as type I, type II, and type III aromatic polyesters. In the first insulating layer 10, the liquid crystal polymer is preferably a type I or type II wholly aromatic polyester. Type I and type II wholly aromatic polyesters are less susceptible to hydrolysis than type III partially aromatic polyesters and are therefore preferred as materials for circuit boards.

The first insulating layer 10 preferably has a thickness T1 (a length in the stacking direction) of about 10 μm or more and about 50 μm or less, for example.

The second insulating layer 20 is in contact with the first insulating layer 10.

The second insulating layer 20 includes a fluoropolymer including at least one of polytetrafluoroethylene (PTFE) and a perfluoroalkoxy alkane (PFA) and includes a polyimide resin with an imidization rate of about 90% or more, the polyimide resin being present in an amount of about 0.5 parts or more by weight and less than about 20 parts by weight per 100 parts by weight of the fluoropolymer, for example.

The second insulating layer 20 only including a fluoropolymer has low adhesiveness to the first insulating layer 10 including a liquid crystal polymer. In contrast, the second insulating layer 20 including about 0.5 parts or more by weight of the polyimide resin with an imidization rate of about 90% or more per 100 parts by weight of the fluoropolymer has high adhesiveness to the first insulating layer 10 and can particularly reduce the decrease in adhesiveness to the first insulating layer 10 caused by moisture absorption. For example, a solvent-soluble polyimide resin described later is soluble in a solvent even in a cured state with an imidization rate of about 90% or more, enters a space in a fluoropolymer powder, and functions as a binder. Thus, the second insulating layer 20 including a solvent-soluble polyimide resin has high adhesiveness to the first insulating layer 10 and has higher bulk strength. In contrast, when a small amount of polyimide precursor before imidization is dispersed in varnish including a fluoropolymer powder, the polyimide precursor is diluted, and polyimide precursor molecules are less likely to come closer to each other. Thus, imidization (cross-linking) by heating after varnish coating does not proceed in the process of forming the second insulating layer 20.

On the other hand, although polytetrafluoroethylene and perfluoroalkoxy alkanes have low hygroscopicity among fluoropolymers, a too high polyimide resin content of the second insulating layer 20 results in a relatively too low fluoropolymer content. Thus, polytetrafluoroethylene or a perfluoroalkoxy alkane cannot exhibit low hygroscopicity as a fluoropolymer. In contrast, when the second insulating layer 20 includes less than about 20 parts by weight of a polyimide resin per 100 parts by weight of the fluoropolymer, polytetrafluoroethylene or a perfluoroalkoxy alkane can sufficiently exhibit low hygroscopicity as a fluoropolymer. Furthermore, the liquid crystal polymer constituting the first insulating layer 10 also has low hygroscopicity, and the circuit board 1 therefore has low hygroscopicity as a whole.

Thus, the circuit board 1 has high adhesion between the first insulating layer 10 and the second insulating layer 20 while maintaining dielectric properties before and after moisture absorption.

The second insulating layer 20 including less than about 0.5 parts by weight of the polyimide resin per 100 parts by weight of the fluoropolymer has low adhesiveness to the first insulating layer 10 and particularly tends to have low adhesiveness to the first insulating layer 10 due to moisture absorption.

On the other hand, the second insulating layer 20 including about 20 parts or more by weight of the polyimide resin per 100 parts by weight of the fluoropolymer has a relatively too low fluoropolymer content and therefore cannot exhibit low hygroscopicity. Thus, moisture absorption of the second insulating layer 20 impairs the dielectric properties of the circuit board 1 or reduces the adhesiveness to the first insulating layer 10.

The second insulating layer 20 preferably includes about 3 parts or more by weight of the polyimide resin and about 10 parts or less by weight of the polyimide resin per 100 parts by weight of the fluoropolymer.

The fluoropolymer and polyimide resin contents of the second insulating layer are determined as described below. First, only the second insulating layer is removed from the circuit board by peeling, scraping, or the like. The second insulating layer is then immersed in an approximately 20% sodium hydroxide solution to elute only the polyimide resin. The weight of resin remaining without being eluted is measured, and the weight of the eluted polyimide resin is determined from the difference between the weight of resin before the elution and the weight of resin after the elution. Whether the eluted resin is the polyimide resin is determined by infrared spectroscopy. After confirming that the resin remaining without being eluted includes the fluoropolymer by infrared spectroscopy, the solution is sequentially filtered, washed with water, dried, and weighed with a microbalance to determine the weight of the fluoropolymer.

In the second insulating layer 20, the fluoropolymer, which is a thermoplastic resin, is including at least one of polytetrafluoroethylene and a perfluoroalkoxy alkane. More specifically, the fluoropolymer may be polytetrafluoroethylene or a perfluoroalkoxy alkane or may be including both polytetrafluoroethylene and a perfluoroalkoxy alkane. Polytetrafluoroethylene and perfluoroalkoxy alkanes have better dielectric properties in a radio-frequency region than liquid crystal polymers.

The fluoropolymer is preferably a perfluoroalkoxy alkane. Perfluoroalkoxy alkanes have higher fluidity than polytetrafluoroethylene and therefore have higher adhesiveness to liquid crystal polymers than polytetrafluoroethylene. Perfluoroalkoxy alkanes can be melt-formed and are therefore easier to handle than polytetrafluoroethylene. Thus, the second insulating layer 20 including a perfluoroalkoxy alkane as a fluoropolymer has higher adhesiveness to the first insulating layer 10 and has higher production efficiency.

In the present description, perfluoroalkoxy alkanes include perfluoroalkoxy alkanes partially substituted with a functional group that contributes to adhesiveness to liquid crystal polymers. Examples of the functional group that contributes to adhesiveness to liquid crystal polymers include an ester group, a carbonate group, a hydroxy group, a carboxy group, a carbonyl fluoride group, and an acid anhydride group.

In the second insulating layer 20, the polyimide resin has an imidization rate of about 90% or more, preferably 100%, for example. When the polyimide resin has an imidization rate of less than about 90%, the adhesion between the first insulating layer 10 and the second insulating layer 20 decreases, and moisture absorption particularly tends to reduce the adhesion between the first insulating layer 10 and the second insulating layer 20.

In the present description, the imidization rate of a polyimide resin refers to the average imidization rate of the polyimide resin in the entire second insulating layer.

The imidization rate of a polyimide resin is determined by X-ray photoelectron spectroscopy (XPS). More specifically, the polyimide resin in the second insulating layer is analyzed by X-ray photoelectron spectroscopy, and a C1s spectrum is waveform-separated into a peak of carbon in an amide bond, a peak of carbon in a carboxy group, and a peak of carbon in an imide carbonyl. The imidization rate of the polyimide resin is determined using the following formula (1):

$$r=[CO\text{—}N\text{—}CO]/\{[CO\text{—}N\text{—}CO]+([CON]+[COOH])/2\} \quad (1)$$

wherein r denotes the imidization rate, $[CO\text{—}N\text{—}CO]$ denotes the peak area ratio of carbon in the imide carbonyl in the C1s spectrum, [CON] denotes the peak area ratio of carbon in the amide bond in the C1s spectrum, and [COOH] denotes the peak area ratio of carbon in the carboxy group in the C1s spectrum.

The imidization rate can be measured in such a manner at five points while etching the second insulating layer separated from the circuit board from one surface to the other surface thereof in the thickness direction, thus determining the average imidization rate of the polyimide resin in the entire second insulating layer. Alternatively, the imidization rate can also be measured in such a manner at five points in the thickness direction on a cross section of the second insulating layer exposed by cutting the circuit board in the stacking direction, thus determining the average imidization rate of the polyimide resin in the entire second insulating layer.

The polyimide resin is preferably a solvent-soluble polyimide resin. The polyimide precursor before imidization is a solution (solvent soluble) and, without imidization treatment (heat curing treatment) by heating (for example, about 350° C. or more, about 400° C. or less), cannot have the characteristics of a polyimide resin, for example, heat resistance, mechanical characteristics, and chemical stability. In contrast, a solvent-soluble polyimide resin is a solution of an imidized polyimide resin and therefore has the characteristics of a polyimide resin. Furthermore, unlike solvent-insoluble polyimide resins, a solvent-soluble polyimide resin can mix easily with the fluoropolymer and tends to increase the production efficiency of the second insulating layer 20. Furthermore, a solvent-soluble polyimide resin has high storage stability, has high processability because the solvent-soluble polyimide resin is liquid and can mix easily with a solvent, and has low processing costs because the solvent-soluble polyimide resin does not require heat treatment only for imidization treatment.

Solvent-soluble polyimide resins are not crystalline resins but amorphous resins. Such a solvent-soluble polyimide resin is produced by appropriately disturbing the molecular structure of a polyimide resin. The molecular structure of a polyimide resin can be appropriately disturbed, for example, by disturbing the regularity of a constitutional unit of the polyimide resin by introduction of a bulky substituent, by copolymerization, or the like. More specifically, a bulky benzene ring may be introduced into a side chain of a polyimide resin, or a hexafluoroisopropylidene group, a fluorenylidene group with a cardo structure, or the like may be introduced into a main chain of a polyimide resin. Whether the polyimide resin in the second insulating layer 20 is solvent-soluble can be determined by analyzing the molecular structure by infrared spectroscopy and by determining whether the polyimide resin is amorphous, whether the regularity of a constitutional unit of the polyimide resin is disturbed by introduction of a substituent, by copolymerization, or the like, as described above.

Examples of an organic solvent in which a solvent-soluble polyimide resin is soluble include phenolic solvents, N-methylpyrrolidone, methylene chloride, and tetrahydrofuran.

The second insulating layer 20 may further include an inorganic filler. An inorganic filler added to the second insulating layer 20 can adjust the coefficient of linear expansion of the second insulating layer 20. This makes easy to adjust the coefficient of linear expansion of the second insulating layer 20 to the coefficients of linear expansion of the first insulating layer 10 and the conductor layer 30. Thus, even when the circuit board 1 thermally expands, this can reduce or prevent separation at the interface between the first insulating layer 10 and the second insulating layer 20. Furthermore, as illustrated in FIG. 1, when the second insulating layer 20 is in contact with the conductor layer 30, this can also reduce or prevent separation at the interface between the second insulating layer 20 and the conductor layer 30. An inorganic filler added to the second insulating layer 20 can also adjust the permittivity of the second insulating layer 20.

When the second insulating layer 20 includes a solvent-soluble polyimide resin and an inorganic filler, the solvent-soluble polyimide resin enters a space of the fluoropolymer powder and a space of the inorganic filler and functions as a binder. This enhances the adhesion between the first insulating layer 10 and the second insulating layer 20 and also increases the bulk strength of the second insulating layer 20 itself.

The inorganic filler may include an inorganic filler with an isotropic shape.

The inorganic filler may include an inorganic filler with an anisotropic shape.

The shape of inorganic filler is determined as described below. First, only the second insulating layer is removed from the circuit board by peeling, scraping, or the like. The second insulating layer is then heated, for example, at about 500° C. or more and about 700° C. or less to burn off the resin in the second insulating layer, for example. Inorganic filler remaining without being burned off is then observed with a scanning electron microscope (SEM) or the like to determine the maximum length and the minimum length from the external shape thereof. The shape of inorganic filler that satisfies "maximum length×⅓≤minimum length" is considered to be an isotropic shape, and the shape of inorganic filler that satisfies "maximum length×⅓>minimum length" is considered to be an anisotropic shape.

Examples of the isotropic shape include regular polyhedron shapes, such as a regular tetrahedron shape and a regular hexahedron shape, and spherical shapes. The regular polyhedron shapes include not only perfect regular polyhedrons but also shapes close to regular polyhedrons. The spherical shapes include not only perfect spherical shapes but also shapes close to spherical shapes.

Examples of the anisotropic shape include plate shapes, needle shapes, and fibrous shapes. The plate shapes include not only tabular shapes but also curved shapes, shapes with a varying thickness, and the like.

The inorganic filler may include boron nitride or fused silica. Boron nitride and fused silica have a low dielectric loss tangent and low hygroscopicity. Boron nitride and fused silica have a higher relative permittivity than liquid crystal polymers.

The second insulating layer 20 including boron nitride or fused silica as inorganic filler can also have a smaller coefficient of linear expansion.

When the inorganic filler is boron nitride, the inorganic filler preferably has a plate shape (anisotropic shape). The plate shapes include not only tabular shapes but also curved shapes, shapes with a varying thickness, and the like.

When the inorganic filler is fused silica, the inorganic filler has a spherical shape (isotropic shape). The spherical shapes include not only perfect spherical shapes but also shapes close to spherical shapes. Whether silica included as inorganic filler in the second insulating layer 20 is fused silica can be determined in terms of whether the silica is spherical.

The inorganic filler may include acicular (anisotropic) wollastonite.

The inorganic filler may include a perovskite compound including an alkaline-earth metal.

The perovskite compound including an alkaline-earth metal preferably includes titanium. Examples of such a perovskite compound including an alkaline-earth metal and titanium include calcium titanate, strontium titanate, barium titanate, and lead zirconate titanate (PZT). These perovskite compounds have a higher relative permittivity than liquid crystal polymers. These perovskite compounds also have a higher relative permittivity than boron nitride and fused silica.

The circuit board 1 is used for an antenna substrate, such as a patch antenna, as described later. In general, the resonant frequency of an antenna substrate is inversely proportional to the product of the length of a radiation electrode and the square root of the permittivity of a substrate on which the radiation electrode is provided. Thus, when the circuit board 1 is used for an antenna substrate and when the conductor layer 30 is a radiation electrode of the antenna substrate, if the second insulating layer 20 includes the perovskite compound including an alkaline-earth metal or the like as inorganic filler and has a higher permittivity, the length of the conductor layer 30 or the radiation electrode can be decreased, and the antenna substrate can consequently be miniaturized.

The second insulating layer 20 may include multiple types of inorganic fillers. In particular, the second insulating layer 20 preferably includes a first inorganic filler and a second inorganic filler with a higher relative permittivity than the first inorganic filler.

The second insulating layer 20 including the first inorganic filler can have a smaller coefficient of linear expansion. Thus, when the circuit board 1 is used for an antenna substrate and when the conductor layer 30 is a radiation electrode of the antenna substrate, if the second insulating layer 20 includes the second inorganic filler and has a higher permittivity, the length of the conductor layer 30 or the radiation electrode can be decreased, and the antenna substrate can consequently be miniaturized.

The first inorganic filler preferably has a higher relative permittivity than the first insulating layer 10. More specifically, the first inorganic filler preferably has a higher relative permittivity than liquid crystal polymers.

The first inorganic filler may have an isotropic shape or an anisotropic shape.

The first inorganic filler is preferably boron nitride or fused silica.

The first inorganic filler may be wollastonite.

The second inorganic filler preferably has a higher relative permittivity than the first insulating layer 10. More specifically, the second inorganic filler preferably has a higher relative permittivity than liquid crystal polymers.

The second inorganic filler may have an isotropic shape or an anisotropic shape.

The second inorganic filler is preferably including a perovskite compound including an alkaline-earth metal.

The shape of the second inorganic filler is determined as described below. First, only the second insulating layer is removed from the circuit board by peeling, scraping, or the like. The second insulating layer is then heated, for example, at about 500° C. or more and about 700° C. or less to burn off the resin in the second insulating layer. Inorganic filler remaining without being burned off is then subjected to elemental analysis by energy dispersive X-ray analysis (EDX) to confirm that the second inorganic filler is included on the basis of information, such as the detection of titanium. The second inorganic filler is then observed with a scanning electron microscope or the like to determine the maximum length and the minimum length from the external shape thereof. The shape of the second inorganic filler that satisfies "maximum length×⅓≤minimum length" is considered to be an isotropic shape, and the shape of the second inorganic filler that satisfies "maximum length×⅓>minimum length" is considered to be an anisotropic shape. The shape of the first inorganic filler is also determined in the same manner.

When the second insulating layer 20 includes the first inorganic filler and the second inorganic filler, the first inorganic filler content and the second inorganic filler content of the second insulating layer 20 can be adjusted to facilitate the adjustment of the permittivity and the coefficient of linear expansion of the second insulating layer 20.

When the second insulating layer 20 includes the first inorganic filler and the second inorganic filler, the first inorganic filler preferably has an anisotropic shape, such as a plate shape, and the second inorganic filler preferably has an isotropic shape, such as a spherical shape. In other words, the second insulating layer 20 preferably includes an inorganic filler with an anisotropic shape and an inorganic filler with an isotropic shape. In such a case, the permittivity of the second insulating layer 20 can be easily adjusted by the second inorganic filler (inorganic filler with an isotropic shape) content, and the coefficient of linear expansion of the second insulating layer 20 in the in-plane direction can be easily adjusted by the first inorganic filler (inorganic filler with an anisotropic shape) content.

The volume percentage of the inorganic filler in the second insulating layer 20 is preferably about 10% or more by volume and about 50% or less by volume, more preferably about 20% or more by volume and about 40% or less by volume, for example. More specifically, the volume percentage of the inorganic filler in the second insulating layer 20 is the total volume percentage of the first inorganic filler and the second inorganic filler in the second insulating layer 20, preferably the total volume percentage of the inorganic filler with an anisotropic shape and the inorganic filler with an isotropic shape in the second insulating layer 20.

When the volume percentage of the inorganic filler in the second insulating layer 20 is in such a range, the permittivity and the coefficient of linear expansion of the second insulating layer 20 can be easily adjusted to desired values, and the second insulating layer 20 can have satisfactory mechanical strength.

When the volume percentage of the inorganic filler in the second insulating layer 20 is less than about 10% by volume, the permittivity and the coefficient of linear expansion of the second insulating layer 20 sometimes cannot be desired values depending on the type of fluoropolymer, inorganic filler, or the like of the second insulating layer 20.

When the volume percentage of the inorganic filler in the second insulating layer 20 is more than about 50% by volume, the second insulating layer 20 may have lower mechanical strength or lower adhesiveness to the first insulating layer 10. To prevent the adhesion between the first insulating layer 10 and the second insulating layer 20 from being lowered, it is important that the second insulating layer 20 includes a polyimide resin, as described above.

The volume percentage of the inorganic filler in the second insulating layer may be determined using a three-dimensional analyzer or may be determined as described below. First, only the second insulating layer is removed from the circuit board by peeling, scraping, or the like, and the volume of the second insulating layer is then determined. The second insulating layer is then heated, for example, at about 500° C. or more and about 700° C. or less to burn off the resin in the second insulating layer. The volume of inorganic filler remaining without being burned off is then measured. The volume percentage of the inorganic filler in the second insulating layer is determined by calculating 100דvolume of inorganic filler"/"volume of second insulating layer".

The second insulating layer 20 preferably has a thickness T2 (a length in the stacking direction) of about 2 μm or more and about 40 μm or less, for example.

The thickness T2 of the second insulating layer 20 may be the same as the thickness T1 of the first insulating layer 10, may be smaller than the thickness T1 of the first insulating layer 10, or may be larger than the thickness T1 of the first insulating layer 10.

The ratio T2/T1 of the thickness T2 of the second insulating layer 20 to the thickness T1 of the first insulating layer 10 is preferably about 0.04 or more and about 4 or less, for example. When the ratio T2/T1 of the thickness T2 of the second insulating layer 20 to the thickness T1 of the first insulating layer 10 is less than about 0.04, the thickness T2 of the second insulating layer 20 is too small compared to the thickness T1 of the first insulating layer 10. Thus, it is difficult to exhibit the low dielectric properties of the fluoropolymer, and it is difficult to improve the dielectric properties of the circuit board 1 in a radio-frequency region. On the other hand, when the ratio T2/T1 of the thickness T2 of the second insulating layer 20 to the thickness T1 of the first insulating layer 10 is more than about 4, the thickness T2 of the second insulating layer 20 is too large compared to the thickness T1 of the first insulating layer 10. Thus, the dimensional accuracy of the circuit board 1 tends to decrease.

As illustrated in FIG. 1, the conductor layer 30 is preferably in contact with the second insulating layer 20. In such a case, the second insulating layer 20 functions as an adhesive layer for the adhesion between the first insulating layer 10 and the conductor layer 30.

Another insulating layer may be located between the second insulating layer 20 and the conductor layer 30.

The conductor layer 30 may have a planar shape spreading over the surface or may have a pattern shape patterned into a wire or the like.

A material of the conductor layer 30 is, for example, copper, silver, aluminum, stainless steel, nickel, gold, or an alloy including at least one of these metals.

The conductor layer 30 is formed of, for example, conductor foil, preferably copper foil. A metal other than copper may be plated on the surface of the copper foil.

The conductor layer 30 preferably has a thickness T3 (length in the stacking direction) of about 1 μm or more and about 35 μm or less, more preferably about 6 μm or more and about 18 μm or less, for example.

The circuit board 1 is used for a flexible printed circuit board (FPC), for example.

The circuit board 1 is produced by the following method, for example.

<Step of Preparing First Insulating Sheet>

A plate or film defining the first insulating sheet including a liquid crystal polymer as a main component is prepared.

The first insulating sheet later becomes the first insulating layer 10.

<Step of Producing Resin Material for Second Insulating Sheet>

A fluoropolymer including at least one of polytetrafluoroethylene and a perfluoroalkoxy alkane and a polyimide resin with an imidization rate of about 90% or more are mixed such that the polyimide resin is about 0.5 parts or more by weight and less than about 20 parts by weight per 100 parts by weight of the fluoropolymer. Thus, a resin material for a second insulating sheet is prepared.

<Step of Forming Second Insulating Sheet>

The resin material for a second insulating sheet is subjected to an extrusion method, a press forming method, or the like to form a plate or film type second insulating sheet.

The second insulating sheet later becomes the second insulating layer 20.

<Step of Preparing First Conductor>

A first conductor, such as copper foil, is prepared. The first conductor later becomes the conductor layer 30.

<Stacking and Thermocompression Bonding Step of First Insulating Sheet, Second Insulating Sheet, and First Conductor>

The first insulating sheet, the second insulating sheet, and the first conductor are stacked in order in the stacking direction and are then subjected to thermocompression bonding. Thus, the first insulating sheet, the second insulating sheet, and the first conductor become the first insulating layer 10, the second insulating layer 20, and the conductor layer 30, respectively.

Thus, the circuit board 1 is produced.

A circuit board according to a preferred embodiment of the present invention can define a multilayer circuit board.

Figure 2:
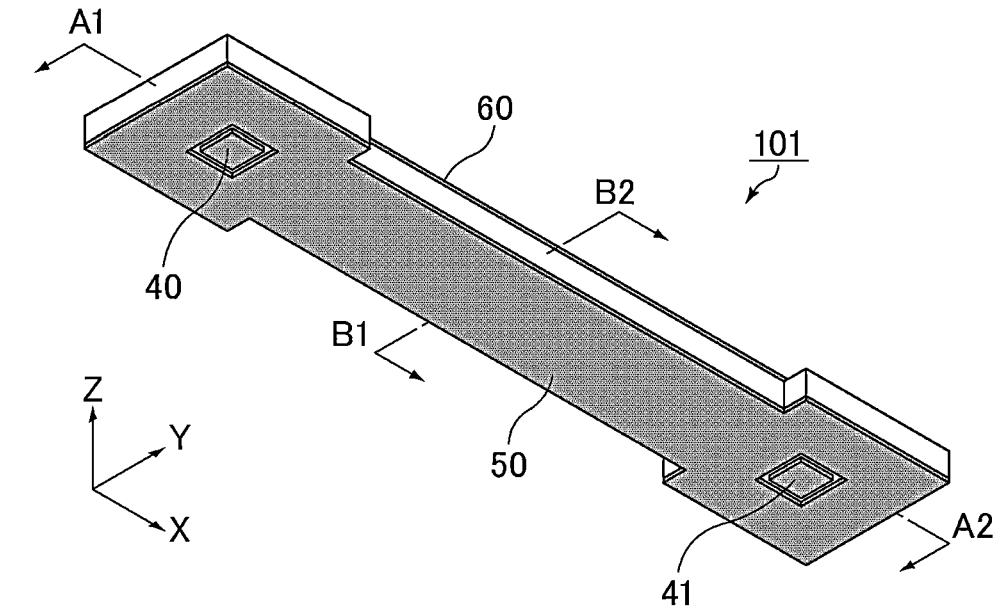
FIG. 2 is a schematic perspective view of an example of a multilayer circuit board according to a preferred embodiment of the present invention.
Figure 3:
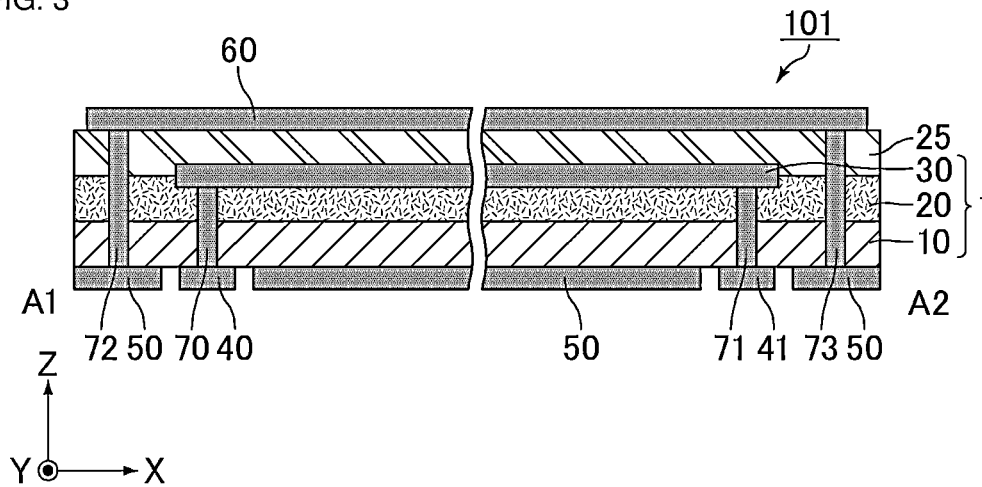
FIG. 3 is a schematic cross-sectional view of a portion corresponding to the line segment A1-A2 of FIG. 2.
Figures 4, 5, 6, 7, 8, 9:
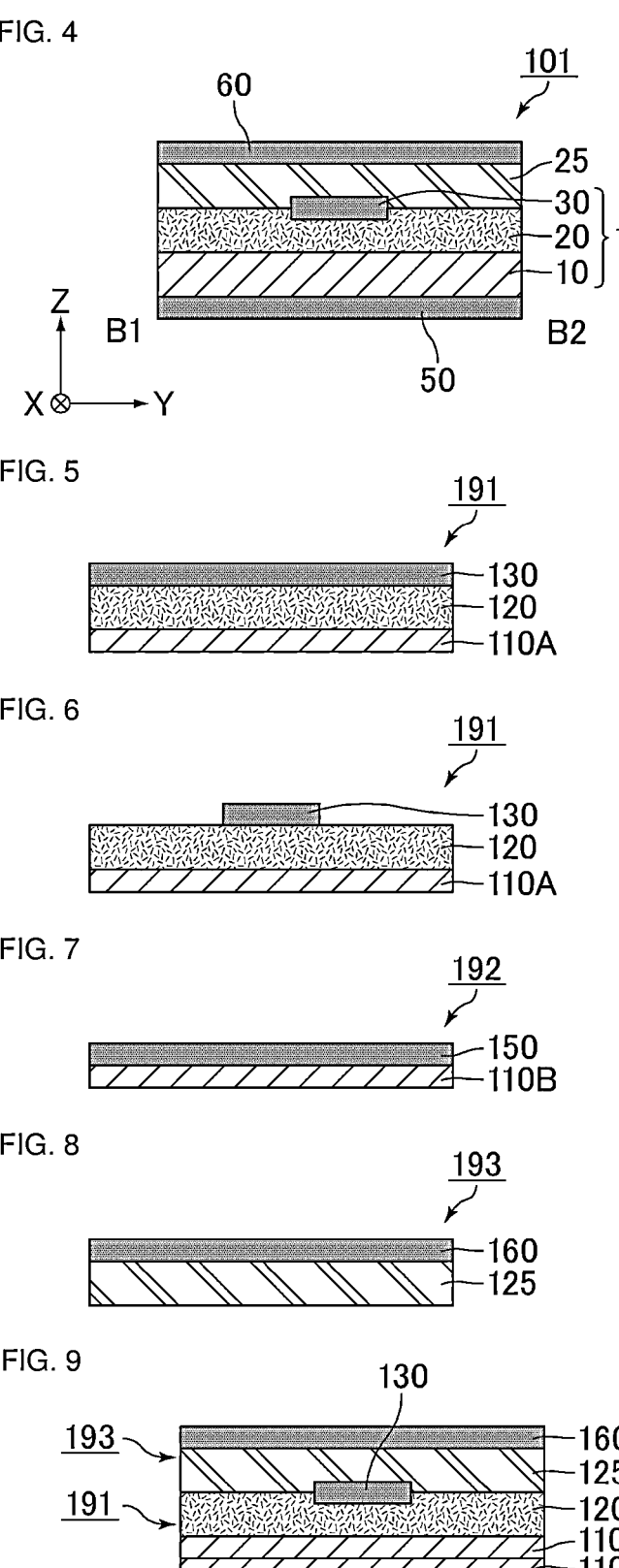
FIG. 4 is a schematic cross-sectional view of a portion corresponding to the line segment B1-B2 of FIG. 2.
FIG. 5 is a schematic cross-sectional view of an example of a step of forming an insulating sheet with a first conductor in a method for producing the multilayer circuit board illustrated in FIG. 2.
FIG. 6 is a schematic cross-sectional view of an example of a first conductor patterning step in the method for producing the multilayer circuit board illustrated in FIG. 2.
FIG. 7 is a schematic cross-sectional view of an example of a step of forming an insulating sheet with a second conductor in the method for producing the multilayer circuit board illustrated in FIG. 2.
FIG. 8 is a schematic cross-sectional view of an example of a step of forming an insulating sheet with a third conductor in the method for producing the multilayer circuit board illustrated in FIG. 2.
FIG. 9 is a schematic cross-sectional view of an example of a stacking and thermocompression bonding step of an insulating sheet with a first conductor, an insulating sheet with a second conductor, and an insulating sheet with a third conductor in the method for producing the multilayer circuit board illustrated in FIG. 2.

FIG. 2 is a schematic perspective view of an example of a multilayer circuit board according to a preferred embodiment of the present invention. FIG. 3 is a schematic cross-sectional view of a portion corresponding to the line segment A1-A2 of FIG. 2. FIG. 4 is a schematic cross-sectional view of a portion corresponding to the line segment B1-B2 of FIG. 2.

As illustrated in FIGS. 2, 3, and 4, a multilayer circuit board 101 includes the first insulating layer 10, the second insulating layer 20, a third insulating layer 25, the conductor layer 30, a mounted electrode 40, a mounted electrode 41, a ground conductor layer 50, a ground conductor layer 60, an interlayer connection conductor 70, an interlayer connection conductor 71, an interlayer connection conductor 72, and an interlayer connection conductor 73.

The first insulating layer 10, the second insulating layer 20, and the conductor layer 30 are stacked in order in the stacking direction (in the Z-direction in FIGS. 2, 3, and 4) and define the circuit board 1. In other words, it can be said that the multilayer circuit board 101 includes the circuit board 1.

The conductor layer 30 is located between the second insulating layer 20 and the third insulating layer 25. As illustrated in FIGS. 3 and 4, the conductor layer 30 preferably extends over the boundary between the second insulating layer 20 and the third insulating layer 25. Thus, the interface between the conductor layer 30 and the second insulating layer 20 and the interface between the conductor layer 30 and the third insulating layer 25 are shifted from the interface between the second insulating layer 20 and the third insulating layer 25 in the stacking direction. This can suppress or prevent separation at the interface between the conductor layer 30 and the second insulating layer 20 and separation at the interface between the conductor layer 30 and the third insulating layer 25.

The third insulating layer 25 is provided in contact with both the second insulating layer 20 and the conductor layer 30 on one surface of the circuit board 1.

The third insulating layer 25 includes a thermoplastic resin, for example. The third insulating layer 25 preferably includes a liquid crystal polymer as a main component among thermoplastic resins.

The mounted electrodes 40 and 41 are located at positions separated from each other on the other surface of the circuit board 1 and are in contact with the first insulating layer 10.

A material of the mounted electrodes 40 and 41 is, for example, copper, silver, aluminum, stainless steel, nickel, gold, or an alloy including at least one of these metals.

The mounted electrodes 40 and 41 are formed of, for example, conductor foil, preferably copper foil. A metal other than copper may be plated on the surface of the copper foil.

The materials of the mounted electrodes 40 and 41 are preferably the same as each other but may be different from each other.

The ground conductor layer 50 is located at a position spaced away from the mounted electrodes 40 and 41 on the other surface of the circuit board 1 and is in contact with the first insulating layer 10.

A material of the ground conductor layer 50 is, for example, copper, silver, aluminum, stainless steel, nickel, gold, or an alloy including at least one of these metals.

The ground conductor layer 50 is formed of, for example, conductor foil, preferably copper foil. A metal other than copper may be plated on the surface of the copper foil.

The ground conductor layer 60 is located on the surface of the third insulating layer 25 opposite the circuit board 1.

A material of the ground conductor layer 60 is, for example, copper, silver, aluminum, stainless steel, nickel, gold, or an alloy including at least one of these metals.

The ground conductor layer 60 is formed of, for example, conductor foil, preferably copper foil. A metal other than copper may be plated on the surface of the copper foil.

The interlayer connection conductor 70 extends through the first insulating layer 10 and the second insulating layer 20 in the stacking direction. Thus, the interlayer connection conductor 70 electrically connects the conductor layer 30 and the mounted electrode 40.

The interlayer connection conductor 71 is located at a position spaced away from the interlayer connection conductor 70 and passes through the first insulating layer 10 and the second insulating layer 20 in the stacking direction. Thus, the interlayer connection conductor 71 electrically connects the conductor layer 30 and the mounted electrode 41.

The interlayer connection conductors 70 and 71 are formed, for example, by plating the inner wall of a via-hole passing through the first insulating layer 10 and the second insulating layer 20 or by filling the via-hole with an electrically conductive paste followed by heat treatment.

The interlayer connection conductor 72 passes through the first insulating layer 10, the second insulating layer 20, and the third insulating layer 25 in the stacking direction. Thus, the interlayer connection conductor 72 electrically connects the ground conductor layer 50 and the ground conductor layer 60.

The interlayer connection conductor 73 is located at a position spaced away from the interlayer connection conductor 72 and passes through the first insulating layer 10, the second insulating layer 20, and the third insulating layer 25 in the stacking direction. Thus, the interlayer connection conductor 73 electrically connects the ground conductor layer 50 and the ground conductor layer 60.

The interlayer connection conductors 72 and 73 are formed, for example, by plating the inner wall of a via-hole passing through the first insulating layer 10, the second insulating layer 20, and the third insulating layer 25 or by filling the via-hole with an electrically conductive paste followed by heat treatment.

When the interlayer connection conductors 70, 71, 72, and 73 are formed by plating, a metal of each interlayer connection conductor is, for example, copper, tin, or silver, preferably copper.

When the interlayer connection conductors 70, 71, 72, and 73 are formed by heat treatment of an electrically conductive paste, a metal included in each interlayer connection conductor is, for example, copper, tin, or silver. Among these, each interlayer connection conductor preferably includes copper, more preferably copper and tin. An interlayer connection conductor including copper and tin causes an alloying reaction with a conductor layer, such as copper foil, at a low temperature, and the interlayer connection conductor and the conductor layer are therefore easily electrically connected.

When the interlayer connection conductors 70, 71, 72, and 73 are formed by heat treatment of an electrically conductive paste, a resin included in each interlayer connection conductor preferably includes at least one thermosetting resin selected from the group consisting of epoxy resins, phenolic resins, polyimide resins, silicon resins and modified resins thereof, and acrylic resins, or at least one thermoplastic resin selected from the group consisting of polyamide resins, polystyrene resins, polymethacrylate resins, polycarbonate resins, and cellulose resins.

The materials of the interlayer connection conductors 70, 71, 72, and 73 are preferably the same as each other but may be different from each other.

The multilayer circuit board 101 includes only one circuit board 1 but may include a plurality of circuit boards 1. In other words, the multilayer circuit board 101 may include at least one circuit board 1. When the multilayer circuit board 101 includes a plurality of circuit boards 1, the circuit boards 1 may be continuously stacked in the stacking direction or may be stacked in the stacking direction with another insulating layer interposed therebetween.

Preferably, the multilayer circuit board 101 has a signal line to transmit a radio-frequency signal as the conductor layer 30 and defines a radio-frequency transmission line. In such a case, the multilayer circuit board 101 constitutes a strip-line type radio-frequency transmission line.

When the conductor layer 30 is a signal line for transmitting a radio-frequency signal, the conductor layer 30 or the signal line is preferably in contact with the second insulating layer 20, as illustrated in FIGS. 3 and 4. The fluoropolymer included in the second insulating layer 20 is including at least one of polytetrafluoroethylene and a perfluoroalkoxy alkane, which have better dielectric properties in a radio-frequency region than liquid crystal polymers. Thus, the second insulating layer 20 in contact with the signal line tends to improve the dielectric properties of the multilayer circuit board 101 in a radio-frequency region.

The surface of the multilayer circuit board 101 is preferably covered with a protective film such that each mounted electrode, such as the mounted electrode 40, the ground conductor layer 50, and the ground conductor layer 60 are exposed.

The multilayer circuit board 101 may be mounted on a substrate via a connector bonded to each mounted electrode, such as the mounted electrode 40. In such a case, the multilayer circuit board 101 can be mounted away from the substrate and therefore can be easily mounted on the substrate even when another component has been mounted on the substrate.

The multilayer circuit board 101 may be mounted on a substrate via a solder provided on each mounted electrode, such as the mounted electrode 40. In such a case, the multilayer circuit board 101 can be mounted close to a substrate, and this can easily reduce the height compared with mounting via a connector as described above.

The first insulating layer 10, the second insulating layer 20, and the third insulating layer 25 constituting the multilayer circuit board 101 each include a thermoplastic resin, and the multilayer circuit board 101 is therefore easy to bend by heating. Thus, the multilayer circuit board 101 can be easily mounted in a small electronic device, such as a communication device. For example, the multilayer circuit board 101 can be formed in advance in a shape corresponding to the arrangement of another component, substrate, or the like of a small electronic device and is easily mounted in a space therebetween.

The multilayer circuit board 101 is produced by the following method, for example. Although a method for producing the multilayer circuit board 101 illustrated in FIG. 2 is described below with reference to the process of forming the cross section illustrated in FIG. 4, this also applies to the process of forming another cross section.

<Step of Forming Insulating Sheet with First Conductor>

FIG. 5 is a schematic cross-sectional view of an example of a step of forming an insulating sheet with a first conductor in a method for producing the multilayer circuit board illustrated in FIG. 2.

As illustrated in FIG. 5, a first conductor 130 is formed on a surface of a second insulating sheet 120 of a multilayer body including a first insulating sheet 110A and the second insulating sheet 120. Thus, an insulating sheet 191 with the first conductor is formed.

The first conductor 130 is formed, for example, by attaching conductor foil, such as copper foil, to a surface of the second insulating sheet 120 of the multilayer body including the first insulating sheet 110A and the second insulating sheet 120.

The first insulating sheet 110A later becomes part of the first insulating layer 10.

The first insulating sheet 110A has a plate or film structure.

The first insulating sheet 110A includes a liquid crystal polymer as a main component.

The second insulating sheet 120 later becomes the second insulating layer 20.

The second insulating sheet 120 has a plate or film structure.

The second insulating sheet 120 includes a fluoropolymer including at least one of polytetrafluoroethylene and a perfluoroalkoxy alkane and includes a polyimide resin with an imidization rate of about 90% or more, the polyimide resin being present in an amount of about 0.5 parts or more by weight and less than about 20 parts by weight per 100 parts by weight of the fluoropolymer, for example.

The first conductor 130 later becomes the conductor layer 30.

A material of the first conductor 130 is, for example, copper, silver, aluminum, stainless steel, nickel, gold, or an alloy including at least one of these metals.

The first conductor 130 is formed of, for example, conductor foil, preferably copper foil. A metal other than copper may be plated on the surface of the copper foil.

The insulating sheet 191 with the first conductor, which has the first conductor 130 on one surface, may have a conductor on the other surface.

<First Conductor Patterning Step>

FIG. 6 is a schematic cross-sectional view of an example of a first conductor patterning step in the method for producing the multilayer circuit board illustrated in FIG. 2.

As illustrated in FIG. 6, the first conductor 130 in the insulating sheet 191 with the first conductor is patterned by photolithography or the like.

In this step, although not illustrated in FIG. 6, a via-hole is formed by laser irradiation or the like at a position where the first conductor 130 is partially exposed, and is filled with an electrically conductive paste by screen printing or the like. The electrically conductive paste later becomes part of each interlayer connection conductor, such as the interlayer connection conductor 70.

<Step of Forming Insulating Sheet with Second Conductor>

FIG. 7 is a schematic cross-sectional view of an example of a step of forming an insulating sheet with a second conductor in the method for producing the multilayer circuit board illustrated in FIG. 2.

As illustrated in FIG. 7, a second conductor 150 is formed on a surface of a first insulating sheet 110B. Thus, an insulating sheet 192 with the second conductor is formed.

The second conductor 150 is formed, for example, by attaching conductor foil, such as copper foil, to a surface of the first insulating sheet 110B.

The first insulating sheet 110B later becomes part of the first insulating layer 10.

The first insulating sheet 110B has a plate or film structure.

The first insulating sheet 110B includes a liquid crystal polymer as a main component.

The second conductor 150 later becomes the ground conductor layer 50.

A material of the second conductor 150 is, for example, copper, silver, aluminum, stainless steel, nickel, gold, or an alloy including at least one of these metals.

The second conductor 150 is formed of, for example, conductor foil, preferably copper foil. A metal other than copper may be plated on the surface of the copper foil.

In this step, although not illustrated in FIG. 7, the second conductor 150 is patterned by photolithography or the like to form a conductor on the surface of the first insulating sheet 110B separately from the second conductor 150. The conductor later becomes each mounted electrode, such as the mounted electrode 40. A via-hole is formed by laser irradiation or the like at a position where the ground conductor layer and each mounted electrode to be formed are partially exposed and is filled with an electrically conductive paste by screen printing or the like. The electrically conductive paste later becomes part of each interlayer connection conductor, such as the interlayer connection conductor 70.

The insulating sheet 192 with the second conductor does not include the second insulating sheet 120 but may include the second insulating sheet 120 between the first insulating sheet 110B and the second conductor 150. The insulating sheet 192 with the second conductor, which has the second conductor 150 on one surface, may have a conductor on the other surface.

<Step of Forming Insulating Sheet with Third Conductor>

FIG. 8 is a schematic cross-sectional view of an example of a step of forming an insulating sheet with a third conductor in a method for producing the multilayer circuit board illustrated in FIG. 2.

As illustrated in FIG. 8, a third conductor 160 is formed on a surface of a third insulating sheet 125. Thus, an insulating sheet 193 with the third conductor is formed.

The third conductor 160 is formed, for example, by attaching conductor foil, such as copper foil, to a surface of the third insulating sheet 125.

The third insulating sheet 125 later becomes the third insulating layer 25.

The third insulating sheet 125 has a plate or film structure.

The third insulating sheet 125 includes a thermoplastic resin, for example. The third insulating sheet 125 preferably includes a liquid crystal polymer as a main component among thermoplastic resins.

The third conductor 160 later becomes the ground conductor layer 60.

A material of the third conductor 160 is, for example, copper, silver, aluminum, stainless steel, nickel, gold, or an alloy including at least one of these metals.

The third conductor 160 is formed of, for example, conductor foil, preferably copper foil. A metal other than copper may be plated on the surface of the copper foil.

In this step, although not illustrated in FIG. 8, a via-hole is formed by laser irradiation or the like at a position where the third conductor 160 is partially exposed, and is filled with an electrically conductive paste by screen printing or the like. The electrically conductive paste later becomes part of each interlayer connection conductor, such as the interlayer connection conductor 72.

The insulating sheet 193 with the third conductor does not include the second insulating sheet 120 but may include the second insulating sheet 120 between the third insulating sheet 125 and the third conductor 160. The insulating sheet 193 with the third conductor, which has the third conductor 160 on one surface, may have a conductor on the other surface.

<Stacking and Thermocompression Bonding Step of Insulating Sheet with First Conductor, Insulating Sheet with Second Conductor, and Insulating Sheet with Third Conductor>

FIG. 9 is a schematic cross-sectional view of an example of a stacking and thermocompression bonding step of an insulating sheet with a first conductor, an insulating sheet with a second conductor, and an insulating sheet with a third conductor in the method for producing the multilayer circuit board illustrated in FIG. 2.

As illustrated in FIG. 9, the insulating sheet 192 with the second conductor, the insulating sheet 191 with the first conductor, the insulating sheet 193 with the third conductor are stacked in order in the stacking direction and are then subjected to thermocompression bonding. The thermocompression bonding is performed such that the first insulating sheet 110A of the insulating sheet 191 with the first conductor is in contact with the first insulating sheet 110B of the insulating sheet 192 with the second conductor and such that both the second insulating sheet 120 and the first conductor 130 of the insulating sheet 191 with the first conductor are in contact with the third insulating sheet 125 of the insulating sheet 193 with the third conductor.

In this step, the first insulating sheet 110A and the first insulating sheet 110B are integrated and form the first insulating layer 10. The second insulating sheet 120, the third insulating sheet 125, the first conductor 130, the second conductor 150, and the third conductor 160 become the second insulating layer 20, the third insulating layer 25, the conductor layer 30, the ground conductor layer 50, and the ground conductor layer 60, respectively. Each conductor formed separately from the second conductor 150 on the surface of the first insulating sheet 110B becomes the corresponding mounted electrode, such as the mounted electrode 40. Furthermore, the electrically conductive paste filled in the via-holes is solidified during thermocompression bonding and forms an interlayer connection conductor, such as the interlayer connection conductor 70, and is connected to the conductor layer 30, the mounted electrode 40, and the like.

Thus, the multilayer circuit board 101 illustrated in FIGS. 2, 3, and 4 is produced.

As described above, a circuit board according to a preferred embodiment of the present invention is also used for an antenna substrate, such as a patch antenna.

Figure 10:
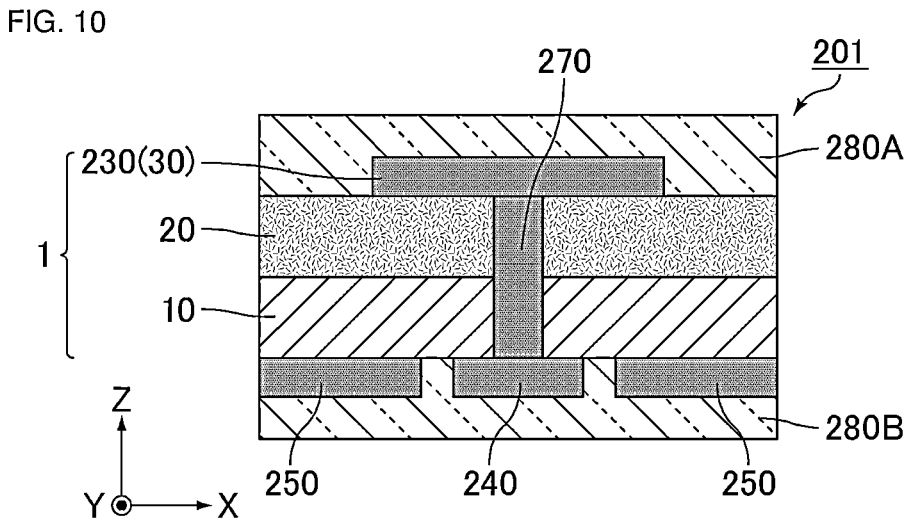
FIG. 10 is a schematic cross-sectional view of an example in which a circuit board according to a preferred embodiment of the present invention is used for an antenna substrate.
Figure 11:
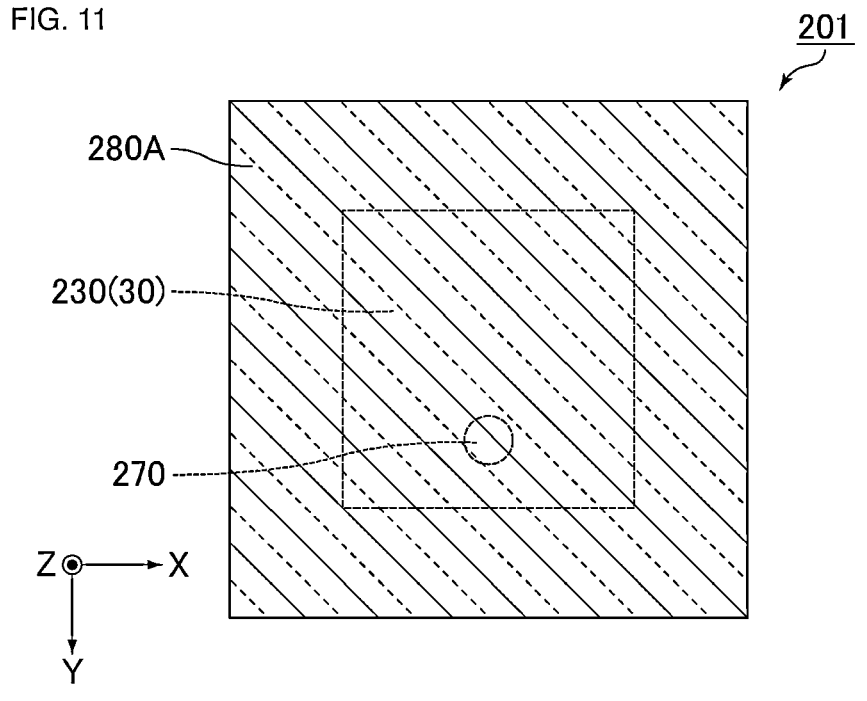
FIG. 11 is a schematic top view of the antenna substrate illustrated in FIG. 10.
Figure 12:
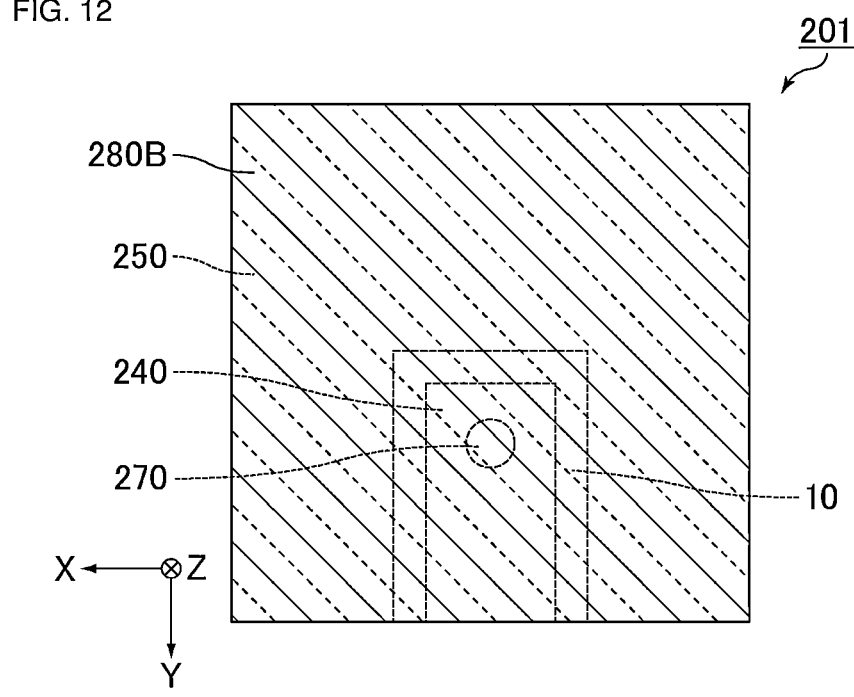
FIG. 12 is a schematic bottom view of the antenna substrate illustrated in FIG. 10.

FIG. 10 is a schematic cross-sectional view of an example in which a circuit board according to a preferred embodiment of the present invention is used for an antenna substrate. FIG. 11 is a schematic top view of the antenna substrate illustrated in FIG. 10. FIG. 12 is a schematic bottom view of the antenna substrate illustrated in FIG. 10.

As illustrated in FIGS. 10, 11, and 12, an antenna substrate 201 includes the first insulating layer 10, the second insulating layer 20, a radiation electrode 230 as the conductor layer 30, a power supply electrode 240, a ground electrode 250, and an interlayer connection conductor 270.

The first insulating layer 10, the second insulating layer 20, and the radiation electrode 230 as the conductor layer 30 are stacked in order in the stacking direction (in the Z-direction in FIG. 10) and define the circuit board 1. In other words, it can be said that the antenna substrate 201 includes the circuit board 1.

The radiation electrode 230 is in contact with the second insulating layer 20. In the structure in which the radiation electrode 230 is in contact with the second insulating layer 20 as described above, when the second insulating layer 20 includes the perovskite compound including an alkaline-earth metal or the like as inorganic filler (second inorganic filler) to increase permittivity, the length of the radiation electrode 230 can be reduced, and the antenna substrate 201 can therefore be miniaturized.

As illustrated in FIGS. 10 and 11, the radiation electrode 230 may be provided on a portion or all of the surface of the second insulating layer 20 opposite the first insulating layer 10.

The power supply electrode 240 is provided on the surface of the first insulating layer 10 opposite the second insulating layer 20. The power supply electrode 240 faces the radiation electrode 230 in the stacking direction.

The power supply electrode 240 may be provided at a position spaced away from the radiation electrode 230 on the surface of the second insulating layer 20 opposite the first insulating layer 10. In such a case, the radiation electrode 230 and the power supply electrode 240 may be directly connected or may be electrically connected via wiring on the surface of the second insulating layer 20 opposite the first insulating layer 10. Furthermore, each of the radiation electrode 230 and the power supply electrode 240 may be connected to a different interlayer connection conductor passing through the second insulating layer 20 at a different position, and the interlayer connection conductor connected to the radiation electrode 230 and the interlayer connection conductor connected to the power supply electrode 240 may be electrically connected via internal wiring provided between the first insulating layer 10 and the second insulating layer 20.

The ground electrode 250 is provided at a position spaced away from the power supply electrode 240 on the surface of the first insulating layer 10 opposite the second insulating layer 20. The ground electrode 250 faces the radiation electrode 230 in the stacking direction.

The ground electrode 250 may be provided on only a portion of the surface of the first insulating layer 10 opposite the second insulating layer 20 as illustrated in FIGS. 10 and 12 or may be provided over the entire surface when the power supply electrode 240 is not provided on the surface of the first insulating layer 10 opposite the second insulating layer 20.

The interlayer connection conductor 270 passes through the first insulating layer 10 and the second insulating layer 20 in the stacking direction. Thus, the interlayer connection conductor 270 electrically connects the radiation electrode 230 and the power supply electrode 240.

As illustrated in FIGS. 10 and 11, the antenna substrate 201 may further include a protective layer 280A.

The protective layer 280A covers the radiation electrode 230 on the surface of the second insulating layer 20 opposite the first insulating layer 10. More specifically, the protective layer 280A is provided to cover the radiation electrode 230 and a region of the surface of the second insulating layer 20 opposite the first insulating layer 10 where the radiation electrode 230 is not provided.

The protective layer 280A covering the region of the surface of the second insulating layer 20 opposite the first insulating layer 10 where the radiation electrode 230 is not provided can suppress or prevent water or the like from entering the inside of the first insulating layer 10 and the second insulating layer 20 from the outside.

The protective layer 280A covering the radiation electrode 230 can protect the surface of the radiation electrode 230 and can suppress or prevent the radiation electrode 230 from being separated from the surface of the second insulating layer 20 opposite the first insulating layer 10.

As illustrated in FIGS. 10 and 12, the antenna substrate 201 may further include a protective layer 280B.

The protective layer 280B covers the power supply electrode 240 and the ground electrode 250 on the surface of the first insulating layer 10 opposite the second insulating layer 20.

The protective layer 280B covering the power supply electrode 240 and the ground electrode 250 can protect the surfaces of the power supply electrode 240 and the ground electrode 250.

The antenna substrate 201 may include a protective layer to cover the side surfaces of the first insulating layer 10 and the second insulating layer 20.

A material of the protective layer 280A and the protective layer 280B is a polyimide resin or silicon oxide, for example.

Each of the protective layer 280A and the protective layer 280B preferably has a thickness (length in the stacking direction) of about 1 μm or more and about 20 μm or less, for example.

The antenna substrate 201 includes only one circuit board 1 but may include a plurality of circuit boards 1. In other words, the antenna substrate 201 may include at least one circuit board 1. When the antenna substrate 201 includes a plurality of circuit boards 1, the circuit boards 1 may be continuously stacked in the stacking direction or may be stacked in the stacking direction with another insulating layer interposed therebetween.

EXAMPLES

Examples of a circuit board according to preferred embodiments of the present invention are specifically disclosed below. Preferred embodiments of the present invention are not limited to these examples.

Example 1

A circuit board according to Example 1 was produced by the following method.
<Step of Preparing First Insulating Sheet>
A first insulating sheet including a type II wholly aromatic polyester, which is a liquid crystal polymer, as a main component was prepared.

20

<Step of Producing Resin Material for Second Insulating Sheet>

A resin material for a second insulating sheet was prepared by mixing 100 parts by weight of a perfluoroalkoxy alkane with 3 parts by weight of a solvent-soluble polyimide resin "Q-AD-X0516" (imidization rate: 90% or more) manufactured by PI R&D Co., Ltd.

<Step of Forming Second Insulating Sheet>

A resin material for a second insulating sheet was formed into a second insulating sheet. The heating temperature for the forming was 350° C.

<Step of Preparing First Conductor>

A copper foil was prepared as a first conductor.

<Stacking and Thermocompression Bonding Step of First Insulating Sheet, Second Insulating Sheet, and First Conductor>

The first insulating sheet, the second insulating sheet, and the first conductor were stacked in order in the stacking direction and were then subjected to thermocompression bonding with a vacuum press machine at 260° C. and at a pressure of 3 MPa for 5 minutes. Thus, the first insulating sheet, the second insulating sheet, and the first conductor became a first insulating layer with a thickness of 50 μm, a second insulating layer with a thickness of 5 μm, and a conductor layer with a thickness of 12 μm, respectively.

Thus, the circuit board according to Example 1 was produced.

Example 2

A circuit board according to Example 2 was produced in the same manner as the circuit board according to Example 1 except that, in the step of producing the resin material for the second insulating sheet, 100 parts by weight of a perfluoroalkoxy alkane was mixed with 1 part by weight of a solvent-soluble polyimide resin "P200" (imidization rate: 90% or more) manufactured by Mitsubishi Gas Chemical Co., Inc. and that, in the step of forming the second insulating sheet, the heating temperature for the forming was 380° C.

Example 3

A circuit board according to Example 3 was produced in the same manner as the circuit board according to Example 2 except that, in the step of producing the resin material for the second insulating sheet, 100 parts by weight of a perfluoroalkoxy alkane was mixed with 2 parts by weight of a solvent-soluble polyimide resin "P200" manufactured by Mitsubishi Gas Chemical Co., Inc.

Example 4

A circuit board according to Example 4 was produced in the same manner as the circuit board according to Example 2 except that, in the step of producing the resin material for the second insulating sheet, 100 parts by weight of a perfluoroalkoxy alkane was mixed with 1 part by weight of a solvent-soluble polyimide resin "S100" (imidization rate: 90% or more) manufactured by Mitsubishi Gas Chemical Co., Inc.

Example 5

A circuit board according to Example 5 was produced in the same manner as the circuit board according to Example 2 except that, in the step of producing the resin material for the second insulating sheet, 100 parts by weight of a perfluoroalkoxy alkane was mixed with 1 part by weight of a solvent-soluble polyimide resin "PIAD (registered trademark) 200" (imidization rate: 90% or more) manufactured by Arakawa Chemical Industries, Ltd.

Example 6

A circuit board according to Example 6 was produced in the same manner as the circuit board according to Example 5 except that, in the step of producing the resin material for the second insulating sheet, 100 parts by weight of a perfluoroalkoxy alkane was mixed with 2 parts by weight of the solvent-soluble polyimide resin "PIAD 200" manufactured by Arakawa Chemical Industries, Ltd. and that the resulting second insulating layer had a thickness of 12 μm.

Example 7

A circuit board according to Example 7 was produced in the same manner as the circuit board according to Example 5 except that, in the step of producing the resin material for the second insulating sheet, 100 parts by weight of a perfluoroalkoxy alkane was mixed with 19 parts by weight of the solvent-soluble polyimide resin "PIAD 200" manufactured by Arakawa Chemical Industries, Ltd. and that the resulting second insulating layer had a thickness of 13 μm.

Comparative Example 1

A circuit board according to Comparative Example 1 was produced in the same manner as the circuit board according to Example 1 except that, in the step of producing the resin material for the second insulating sheet, the polyimide resin was not mixed, that is, only the perfluoroalkoxy alkane was used.

Comparative Example 2

A circuit board according to Comparative Example 2 was produced in the same manner as the circuit board according to Example 2 except that, in the step of producing the resin material for the second insulating sheet, 100 parts by weight of a perfluoroalkoxy alkane was mixed with 1 part by weight of a polyimide precursor (poly(amic acid)) "UPIA (registered trademark)" (imidization rate: less than 90%) manufactured by Ube Industries, Ltd.

Comparative Example 3

A circuit board according to Comparative Example 3 was produced in the same manner as the circuit board according to Example 5 except that, in the step of producing the resin material for the second insulating sheet, 100 parts by weight of a perfluoroalkoxy alkane was mixed with 30 parts by weight of the solvent-soluble polyimide resin "PIAD 200" manufactured by Arakawa Chemical Industries, Ltd. and that the resulting second insulating layer had a thickness of 11 μm.

Comparative Example 4

A circuit board according to Comparative Example 4 was produced in the same manner as the circuit board according to Example 5 except that, in the step of producing the resin material for the second insulating sheet, 100 parts by weight of a perfluoroalkoxy alkane was mixed with 40 parts by weight of the solvent-soluble polyimide resin "PIAD 200" manufactured by Arakawa Chemical Industries, Ltd. and that the resulting second insulating layer had a thickness of 15 μm.

Evaluation

The circuit boards according to Examples 1 to 7 and Comparative Examples 1 to 4 were examined as described below. Table 1 shows the results.

<Adhesiveness>

The circuit board of each example was subjected to a 180-degree peeling test and a 90-degree peeling test according to JIS C 6471 except that the first insulating layer was separated from the second insulating layer, thus measuring the 180-degree peel strength and the 90-degree peel strength of the first insulating layer and the second insulating layer. Each peeling test was performed before and after a moisture absorption test in both the longitudinal direction (the machine direction (MD) in Table 1) and the width direction (the transverse direction (TD) in Table 1) during continuous production of the circuit board. The moisture absorption test was a pressure cooker test performed at 121° C., 2 atm, and 100% RH for one hour.

<Dielectric Properties>

The circuit board of each example was dried at 80° C. for 30 minutes (a state after drying). The circuit board of each example was then immersed in water at 23° C. for 24 hours in accordance with JIS C 6481 to absorb moisture (a state after moisture absorption). The relative permittivity and the dielectric loss tangent of the circuit board of each example in the state after drying and in the state after moisture absorption were measured by a resonator vibration method (TEoii mode) at 3 GHz.

<Blistering>

The circuit board of each example was subjected to the pressure cooker test as the moisture absorption test at 121° C., 2 atm, and 100% RH for 30 minutes and was then subjected to a solder float test according to JIS C 5012. The circuit board of each example was rated as good (O) when no blistering was observed and was rated as poor (X) when blistering was observed.

TABLE 1

| | | | | Example 1 | Example 2 | Example 3 | Example 4 | Example 5 | Example 6 |
|---|---|---|---|---|---|---|---|---|---|
| Adhesion | 180° peel strength (N/mm) | MD | Before moisture absorption test | 0.68 | 0.84 | 0.79 | 0.80 | 0.82 | 0.85 |
| | | | After moisture absorption test | 0.45 | 0.74 | 0.62 | 0.75 | 0.66 | 0.76 |
| | | TD | Before moisture absorption test | 0.67 | 0.83 | 0.79 | 0.77 | 0.81 | 0.84 |
| | | | After moisture absorption test | 0.40 | 0.78 | 0.58 | 0.74 | 0.64 | 0.78 |
| | 90° peel strength (N/mm) | MD | Before moisture absorption test | 0.33 | 0.60 | 0.59 | 0.58 | 0.60 | 0.68 |
| | | | After moisture absorption test | 0.47 | 0.60 | 0.58 | 0.52 | 0.60 | 0.64 |
| | | TD | Before moisture absorption test | 0.32 | 0.59 | 0.55 | 0.58 | 0.64 | 0.66 |
| | | | After moisture absorption test | 0.39 | 0.58 | 0.55 | 0.52 | 0.58 | 0.61 |
| Dielectric properties | Relative permittivity | | After drying | 3.26 | 3.28 | 3.30 | 3.32 | 3.27 | 3.15 |
| | | | After moisture absorption | 3.27 | 3.32 | 3.32 | 3.31 | 3.31 | 3.15 |
| | Dielectric loss tangent | | After drying | 0.00170 | 0.00214 | 0.00217 | 0.00210 | 0.00213 | 0.00190 |
| | | | After moisture absorption | 0.00190 | 0.00225 | 0.00227 | 0.00226 | 0.00222 | 0.00194 |
| | | | Blistering | ○ | ○ | ○ | ○ | ○ | ○ |

| | | | | Example 7 | Comparative Example 1 | Comparative Example 2 | Comparative Example 3 | Comparative Example 4 |
|---|---|---|---|---|---|---|---|---|
| Adhesion | 180° peel strength (N/mm) | MD | Before moisture absorption test | 0.70 | 0.56 | 0.74 | 0.60 | 0.59 |
| | | | After moisture absorption test | 0.66 | 0.15 | 0.06 | 0.42 | 0.54 |
| | | TD | Before moisture absorption test | 0.73 | 0.55 | 0.74 | 0.60 | 0.60 |
| | | | After moisture absorption test | 0.69 | 0.14 | 0.04 | 0.44 | 0.56 |
| | 90° peel strength (N/mm) | MD | Before moisture absorption test | 0.55 | 0.29 | 0.42 | 0.46 | 0.42 |
| | | | After moisture absorption test | 0.46 | 0.12 | 0.03 | 0.40 | 0.35 |
| | | TD | Before moisture absorption test | 0.58 | 0.27 | 0.45 | 0.46 | 0.43 |
| | | | After moisture absorption test | 0.50 | 0.12 | 0.04 | 0.46 | 0.36 |
| Dielectric properties | Relative permittivity | | After drying | 3.16 | 3.26 | 3.28 | 3.18 | 3.17 |
| | | | After moisture absorption | 3.17 | 3.27 | 3.30 | 3.20 | 3.18 |
| | Dielectric loss tangent | | After drying | 0.00195 | 0.00170 | 0.00200 | 0.00190 | 0.00200 |
| | | | After moisture absorption | 0.00201 | 0.00190 | 0.00211 | 0.00198 | 0.00205 |
| | | | Blistering | ○ | ○ | ○ | x | x |

As shown in Table 1, the circuit boards according to Examples 1 to 7, which included the polyimide resin in the second insulating layer, maintained high peel strength before and after the moisture absorption test. In other words, the circuit boards according to Examples 1 to 7 had high adhesion between the first insulating layer and the second insulating layer before and after the moisture absorption.

The circuit boards according to Examples 1 to 7 had higher peel strength before and after the moisture absorption test than the circuit board according to Comparative Example 1, which did not include the polyimide resin in the second insulating layer. Furthermore, the circuit boards according to Examples 1 to 7 had higher peel strength after the moisture absorption test than the circuit board according to Comparative Example 2, in which the imidization rate of the polyimide resin included in the second insulating layer was less than 90%.

Although including the polyimide resin in addition to the fluoropolymer in the second insulating layer, the circuit boards according to Examples 1 to 7 had good dielectric properties indicated by relative permittivity and dielectric loss tangent after drying and after moisture absorption, which were much the same as the circuit board according to Comparative Example 1. Thus, the circuit boards according to Examples 1 to 7 maintained the dielectric properties before and after the moisture absorption.

The circuit boards according to Examples 1 to 7 had no blistering due to moisture absorption. In contrast, the circuit boards according to Comparative Examples 3 and 4, which included 20 parts or more by weight of the polyimide resin per 100 parts by weight of the fluoropolymer in the second insulating layer, had blistering due to moisture absorption.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising, in order in a stacking direction:
a first insulating layer;
a second insulating layer in contact with the first insulating layer; and
a conductor layer; wherein
the first insulating layer includes a liquid crystal polymer as a main component;
the second insulating layer includes a fluoropolymer including at least one of polytetrafluoroethylene and a perfluoroalkoxy alkane and includes a polyimide resin with an imidization rate of about 90% or more, the polyimide resin being present in an amount of about 0.5 parts or more by weight and less than about 20 parts by weight per 100 parts by weight of the fluoropolymer;
the polyimide resin is a solvent-soluble polyimide resin; and
the second insulating layer is in direct contact with the conductor.

2. The circuit board according to claim 1, wherein the fluoropolymer is a perfluoroalkoxy alkane.

3. The circuit board according to claim 1, wherein the liquid crystal polymer is a type I or type II wholly aromatic polyester.

4. The circuit board according to claim 1, wherein the second insulating layer further includes an inorganic filler.

5. The circuit board according to claim 4, wherein the inorganic filler includes an inorganic filler with an isotropic shape.

6. The circuit board according to claim 4, wherein the inorganic filler includes an inorganic filler with an anisotropic shape.

7. The circuit board according to claim 4, wherein the inorganic filler includes boron nitride or fused silica.

8. The circuit board according to claim 4, wherein the inorganic filler includes a perovskite compound including an alkaline-earth metal.

9. The circuit board according to claim 4, wherein the second insulating layer includes multiple types of the inorganic filler.

10. The circuit board according to claim 9, wherein the second insulating layer includes a first inorganic filler and a second inorganic filler with a higher relative permittivity than the first inorganic filler.

11. The circuit board according to claim 10, wherein the first inorganic filler is boron nitride or fused silica.

12. The circuit board according to claim 10, wherein the second inorganic filler includes a perovskite compound including an alkaline-earth metal.

13. The circuit board according to claim 1, wherein a ratio of a thickness of the second insulating layer to a thickness of the first insulating layer is about 0.04 or more and about 4 or less.

14. The circuit board according to claim 1, wherein the conductor layer includes copper foil.

15. The circuit board according to claim 1, wherein the solvent-soluble polyimide resin is a solution of an imidized polyimide resin.

16. The circuit board according to claim 1, wherein the solvent-soluble polyimide resin is an amorphous resin.

17. The circuit board according to claim 1, wherein the solvent-soluble polyimide resin has a disturbed molecular structure of a polyimide resin.

18. A multilayer circuit board comprising at least one circuit board according to claim 1.

19. The multilayer circuit board according to claim 18, wherein the multilayer circuit board includes a signal line to transmit a radio-frequency signal as the conductor layer and defines a radio-frequency transmission line.

20. The multilayer circuit board according to claim 19, wherein the signal line is in contact with the second insulating layer.

21. The circuit board according to claim 1, wherein the conductor is a radiation electrode.

* * * * *